US009040226B2

(12) United States Patent
Boukaftane

(10) Patent No.: US 9,040,226 B2
(45) Date of Patent: May 26, 2015

(54) METHOD OF IMPROVING PRINT PERFORMANCE IN FLEXOGRAPHIC PRINTING PLATES

(71) Applicant: MacDermid Printing Solutions, LLC, Waterbury, CT (US)

(72) Inventor: Chouaib Boukaftane, Decatur, GA (US)

(*) Notice: Subject to any disclaimer, the term of this patent is extended or adjusted under 35 U.S.C. 154(b) by 0 days.

(21) Appl. No.: 13/892,406

(22) Filed: May 13, 2013

(65) Prior Publication Data
US 2014/0335456 A1 Nov. 13, 2014

(51) Int. Cl.
*G03F 7/00* (2006.01)
*G03F 7/20* (2006.01)

(52) U.S. Cl.
CPC ........................................ *G03F 7/20* (2013.01)

(58) Field of Classification Search
CPC ....... G03F 7/2004; G03F 7/027; G03F 7/105; G03F 7/18; G03F 1/68; B41C 1/00; B41C 1/003; B41C 1/05; B41C 1/18; B41N 7/005; B41M 5/42
USPC ........................................................ 430/306
See application file for complete search history.

(56) References Cited

U.S. PATENT DOCUMENTS

| 3,265,765 A | 8/1966 | Holden et al. |
| 3,867,153 A | 2/1975 | MacLachlan |
| 4,264,705 A | 4/1981 | Allen |
| 4,320,188 A | 3/1982 | Heinz et al. |
| 4,323,636 A | 4/1982 | Chen |
| 4,323,637 A | 4/1982 | Chen et al. |
| 4,369,246 A | 1/1983 | Chen et al. |
| 4,423,135 A | 12/1983 | Chen et al. |
| 4,427,759 A | 1/1984 | Gruetzmacher et al. |
| 4,622,088 A | 11/1986 | Min |
| 5,135,827 A | 8/1992 | Bohm et al. |
| 5,223,375 A | 6/1993 | Berrier et al. |
| 5,262,275 A | 11/1993 | Fan |
| 5,925,500 A | 7/1999 | Yang et al. |
| 6,238,837 B1 | 5/2001 | Fan |
| 7,682,775 B2 | 3/2010 | Rapp et al. |
| 8,158,331 B2 | 4/2012 | Recchia |
| 2010/0136483 A1* | 6/2010 | Lungu ........................ 430/270.1 |
| 2010/0201039 A1 | 8/2010 | Leenders et al. |
| 2011/0079158 A1 | 4/2011 | Recchia et al. |
| 2011/0219972 A1* | 9/2011 | Daems et al. .............. 101/401.1 |

FOREIGN PATENT DOCUMENTS

| EP | 0456336 | 6/1997 |
| EP | 0640878 | 2/2003 |
| GB | 1366769 A | 9/1974 |

* cited by examiner

*Primary Examiner* — Chanceity Robinson
(74) *Attorney, Agent, or Firm* — Carmody Torrance Sandak & Hennessey LLP

(57) ABSTRACT

A method of tailoring the shape of a plurality of relief printing dots created in a photosensitive printing blank during a plate-making process including the steps of: (a) selectively exposing at least one photocurable layer to a source of actinic radiation to selectively crosslink and cure the at least one photocurable layer; and (b) developing the exposed at least one photocurable layer to reveal the relief image therein, said relief image comprising the plurality of relief printing dots. The source of actinic radiation comprises a source of UV light in the UV-A range and a source of light in the UV-C range. The at least one photocurable layer is simultaneously exposed to the source of UV light in the UV-A range and the source of UV light in the UV-C range to produce printing dots having at least one desired geometric characteristic.

12 Claims, 8 Drawing Sheets

Formulation 1                    Formulation 2

UVA + No UVC

UVA + 1 min UVC

Formulation 1

Formulation 2

3 min UVC then UVA · UVA then 3 min UVC · Formulation 1 · Formulation 2

METHOD OF IMPROVING PRINT PERFORMANCE IN FLEXOGRAPHIC PRINTING PLATES

FIELD OF THE INVENTION

The present invention relates generally to a method of tailoring the shape of printing dots created during the production of relief image printing plates to configure such printing dots for optimal printing on various substrates.

BACKGROUND OF THE INVENTION

Flexography is a method of printing that is commonly used for high-volume runs. Flexography is employed for printing on a variety of substrates such as paper, paperboard stock, corrugated board, films, foils and laminates. Newspapers and grocery bags are prominent examples. Coarse surfaces and stretch films can be economically printed only by means of flexography.

Flexographic printing plates are relief plates with image elements raised above open areas. Generally, the plate is somewhat soft, and flexible enough to wrap around a printing cylinder, and durable enough to print over a million copies. Such plates offer a number of advantages to the printer, based chiefly on their durability and the ease with which they can be made. A typical flexographic printing plate as delivered by its manufacturer is a multilayered article made of, in order, a backing or support layer; one or more unexposed photocurable layers; optionally a protective layer or slip film; and often, a protective cover sheet.

The support (or backing) layer lends support to the plate. The support layer can be formed from a transparent or opaque material such as paper, cellulose film, plastic, or metal. Preferred materials include sheets made from synthetic polymeric materials such as polyesters, polystyrene, polyolefins, polyamides, and the like. The support may be in sheet form or in cylindrical form, such as a sleeve. The sleeve may be formed from single layer or multiple layers of flexible material. Flexible sleeves made of polymeric films are preferred, as they typically are transparent to ultraviolet radiation and thereby accommodate backflash exposure for building a floor in the cylindrical printing element. One widely used support layer is a flexible film of polyethylene terephthalate.

The photocurable layer(s) can include any of the known photopolymers, monomers, initiators, reactive or non-reactive diluents, fillers, and dyes. As used herein, the term "photocurable" refers to a composition which undergoes polymerization, crosslinking, or any other curing or hardening reaction in response to actinic radiation with the result that the unexposed portions of the material can be selectively separated and removed from the exposed (cured) portions to form a three-dimensional relief pattern of cured material. Exemplary photocurable materials are disclosed in European Patent Application Nos. 0 456 336 A2 and 0 640 878 A1 to Goss, et al., British Patent No. 1,366,769, U.S. Pat. No. 5,223,375 to Berrier, et al., U.S. Pat. No. 3,867,153 to MacLahan, U.S. Pat. No. 4,264,705 to Allen, U.S. Pat. Nos. 4,323,636, 4,323,637, 4,369,246, and 4,423,135 all to Chen, et al., U.S. Pat. No. 3,265,765 to Holden, et al., U.S. Pat. No. 4,320,188 to Heinz, et al., U.S. Pat. No. 4,427,759 to Gruetzmacher, et al., U.S. Pat. No. 4,622,088 to Min, and U.S. Pat. No. 5,135,827 to Bohm, et al., the subject matter of each of which is herein incorporated by reference in its entirety. More than one photocurable layer may also be used.

Photocurable materials generally cross-link (cure) and harden through radical polymerization in at least some actinic wavelength region. As used herein, "actinic radiation" is radiation that is capable of polymerizing, crosslinking or curing the photocurable layer. Actinic radiation includes, for example, amplified (e.g., laser) and non-amplified light, particularly in the UV and violet wavelength regions.

The slip film is a thin layer, which protects the photopolymer from dust and increases its ease of handling. In a conventional ("analog") plate making process, the slip film is transparent to UV light, and the printer peels the cover sheet off the printing plate blank, and places a negative on top of the slip film layer. The plate and negative are then subjected to flood-exposure by UV light through the negative. The areas exposed to the light cure, or harden, and the unexposed areas are removed (developed) to create the relief image on the printing plate. In the alternative, a negative may be placed directly on the at least one photocurable layer.

In a "digital" or "direct to plate" process, a laser is guided by an image stored in an electronic data file, and is used to create an in situ negative in a digital (i.e., laser ablatable) masking layer, which is generally a slip film which has been modified to include a radiation opaque material. Portions of the laser ablatable layer are then ablated by exposing the masking layer to laser radiation at a selected wavelength and power of the laser. Thereafter, the at least one photocurable layer with the in situ negative thereon, is subjected to flood-exposure by UV light through the in situ negative. The areas exposed to the light cure, or harden, and the unexposed areas are removed (developed) to create the relief image on the printing plate. Selective exposure to the source of actinic radiation can be achieved using either the analog or digital method. Examples of laser ablatable layers are disclosed, for example, in U.S. Pat. No. 5,925,500 to Yang, et al., and U.S. Pat. Nos. 5,262,275 and 6,238,837 to Fan, the subject matter of each of which is herein incorporated by reference in its entirety.

Processing steps for forming relief image printing elements typically include the following:

1) Image generation, which may be mask ablation for digital "computer to plate" printing plates or negative production for conventional analog plates;
2) Face exposure through the mask (or negative) to selectively crosslink and cure portions of the photocurable layer not covered by the mask, thereby creating the relief image;
3) Back exposure to create a floor layer in the photocurable layer and establish the depth of relief. It is preferred to face expose the plate before flipping it for back exposure. Doing the back exposure first may result in damaging the black mask during the plate handling, thus contributing to image degradation. Some exposing systems can also run both exposure systems simultaneously, which also preserves the image integrity;
4) Development to remove unexposed photopolymer by solvent (including water) or dry "thermal" development; and
5) If necessary, post exposure and detackification.

Removable coversheets may be provided to protect the photocurable printing element from damage during transport and handling. Useful cover sheets include flexible polymeric films, e.g., polystyrene, polyethylene, polypropylene, polycarbonate, fluoropolymers, polyamide or polyesters. Polyesters, especially polyethylene terephthalate, are commonly used.

Prior to processing the printing elements, the coversheet(s) are removed and the photosensitive surface is exposed to actinic radiation in an imagewise fashion. Upon imagewise exposure to actinic radiation, polymerization, and hence, insolubilization of the photopolymerizable layer occurs in the exposed areas. Treatment with a suitable developer solvent (or thermal development) removes the unexposed areas of the photopolymerizable layer, leaving a printing relief that can be used for flexographic printing.

As used herein "back exposure" refers to a blanket exposure to actinic radiation of the photopolymerizable layer on the side opposite that which does, or ultimately will, bear the relief. This step is typically accomplished through a transparent support layer and is used to create a shallow layer of photocured material, i.e., the "floor," on the support side of the photocurable layer. The purpose of the floor is generally to sensitize the photocurable layer and to establish the depth of relief.

Prior to the brief back exposure step (i.e., brief as compared to the imagewise exposure step), an imagewise exposure is performed utilizing a digitally-imaged mask or a photographic negative mask, which is in contact with the photocurable layer and through which actinic radiation is directed.

The type of radiation used is dependent in part on the type of photoinitiator in the photopolymerizable layer. The digitally-imaged mask or photographic negative prevents the material beneath from being exposed to the actinic radiation and hence those areas covered by the mask do not polymerize, while the areas not covered by the mask are exposed to actinic radiation and polymerize. Any conventional sources of actinic radiation can be used for this exposure step. Examples of suitable visible and UV sources include carbon arcs, mercury-vapor arcs, fluorescent lamps, electron flash units, electron beam units and photographic flood lamps.

The ultraviolet (UV) spectrum refers to all electromagnetic radiation with wavelengths in the range of about 10-400 nm and is generally divided into four regions—(1) UV-A; (2) UV-B; (3) UV-C; and (4) Vacuum Ultraviolet.

(1) The UV-A region comprises wavelengths from about 315 nm to about 400 nm;
(2) The UV-B region comprises wavelengths from about 280 to about 315 nm.
(3) The UV-C region comprises shorter wavelengths from about 200 to about 280 nm. and
(4) The Vacuum Ultraviolet region comprises wavelengths from about 10-200 nm and can only be used in a vacuum.

After imaging, the photosensitive printing element is developed to remove the unpolymerized portions of the layer of photocurable material and reveal the crosslinked relief image in the cured photosensitive printing element. Typical methods of development include washing with various solvents or water, often with a brush. Other possibilities for development include the use of an air knife or thermal development, which typically uses heat plus a blotting material. The resulting surface has a relief pattern, which typically comprises a plurality of dots that reproduces the image to be printed. After the relief image is developed, the resulting relief image printing element may be mounted on a press and printing commenced.

The shape of the dots and the depth of the relief, among other factors, affect the quality of the printed image. In addition, it is very difficult to print small graphic elements such as fine dots, lines and even text using flexographic printing plates while maintaining open reverse text and shadows. In the lightest areas of the image (commonly referred to as highlights) the density of the image is represented by the total area of dots in a halftone screen representation of a continuous tone image. For Amplitude Modulated (AM) screening, this involves shrinking a plurality of halftone dots located on a fixed periodic grid to a very small size, the density of the highlight being represented by the area of the dots. For Frequency Modulated (FM) screening, the size of the halftone dots is generally maintained at some fixed value, and the number of randomly or pseudo-randomly placed dots represent the density of the image. In both cases, it is necessary to print very small dot sizes to adequately represent the highlight areas.

Maintaining small dots on flexographic plates can be very difficult due to the nature of the platemaking process. In digital platemaking processes that use a UV-opaque mask layer, the combination of the mask and UV exposure produces relief dots that have a generally conical shape. The smallest of these dots are prone to being removed during processing, which means no ink is transferred to these areas during printing (i.e., the dot is not "held" on plate and/or on press). Alternatively, if the dots survive processing they are susceptible to damage on press. For example small dots often fold over and/or partially break off during printing, causing either excess ink or no ink to be transferred.

As described in U.S. Pat. No. 8,158,331 to Recchia and U.S. Pat. Pub. No. 2011/0079158 to Recchia et al., the subject matter of each of which is herein incorporated by reference in its entirety, it has been found that a particular set of geometric characteristics define a flexo dot shape that yields superior printing performance, including but not limited to (1) planarity of the dot surface; (2) shoulder angle of the dot; (3) depth of relief between the dots; and (4) sharpness of the edge at the point where the dot top transitions to the dot shoulder.

However, there remains a need in the art for selectively crosslinking and curing photosensitive printing blanks to achieve desired certain geometric characteristics of the relief printing dots created therein.

SUMMARY OF THE INVENTION

It is an object of the present invention to provide a method of tailoring or modifying the shape of relief printing dots in a relief image printing element for optimal printing on various substrates and/or under various conditions.

It is another object of the present invention to provide an improved method of producing relief image printing elements to produce printing dots having certain desired geometric characteristics.

It is still another object of the present invention to create a relief image printing element that comprises printing dots having a superior dot structure in terms of print surface, edge definition, shoulder angle, depth and dot height.

The present invention relates generally to a method of tailoring the shape of a plurality of relief printing dots created in a photosensitive printing blank during a platemaking process, said photosensitive printing blank comprising at least one photocurable layer disposed on a backing layer, the method comprising the steps of:

a) selectively exposing the at least one photocurable layer to a source of actinic radiation to selectively crosslink and cure portions of the at least one photocurable layer; and b) developing the exposed at least one photocurable layer to reveal the relief image therein, said relief image comprising the plurality of relief printing dots;

wherein the source of actinic radiation comprises at least one source of UV light in the UV-A range and at least one source of light in the UV-C range, wherein the at least one photocurable layer is simultaneously exposed to the at least one source of UV light in the UV-A range and the at least one source of UV light in the UV-C range;

whereby printing dots are produced having at least one geometric characteristic selected from the group consisting of a desired planarity of a top surface of the relief printing dots, a desired shoulder angle of the relief printing dots and a desired edge sharpness of the relief printing dots.

DETAILED DESCRIPTION OF THE PREFERRED EMBODIMENTS

Figure 1:
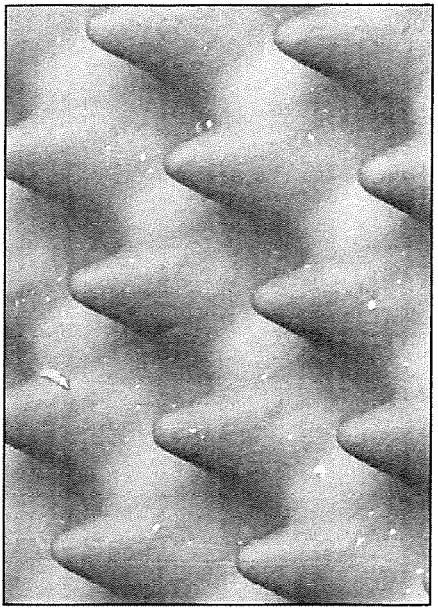
FIG. 1 depicts SEMs of 10% dots imaged using UV-A radiation and 1 minute of UV-C radiation simultaneously as compared with just UV-A radiation.
Figure 1:
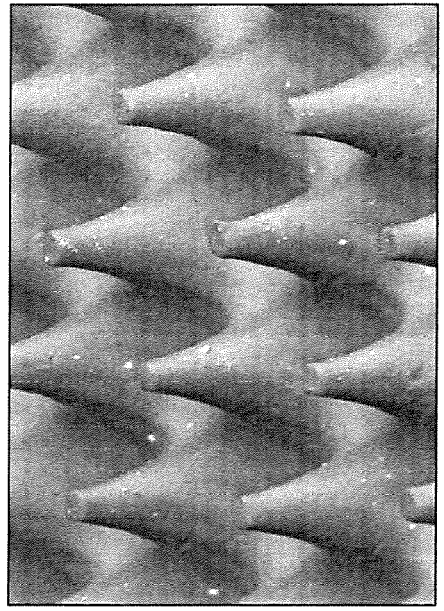
Figure 1:
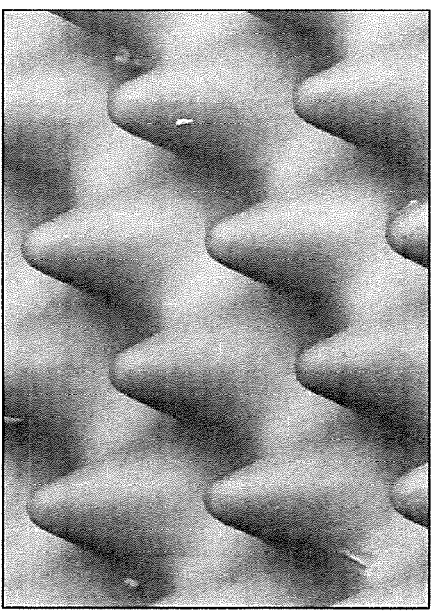
Figure 1:
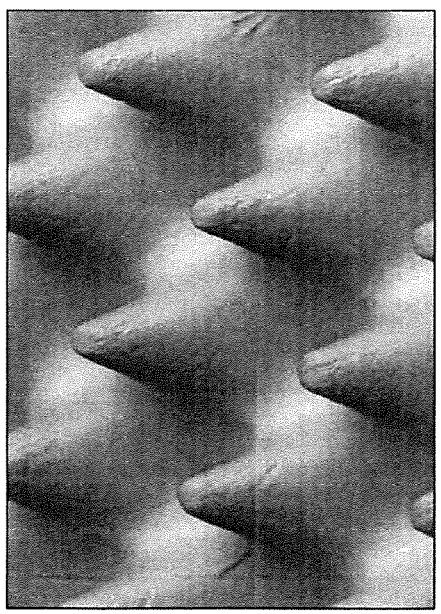

The inventors of the present invention have determined that the shape and structure of the printing dots in a relief image printing element has a profound impact on the way the relief image printing element prints.

In addition, the inventors of the present invention have determined that the shape and structure of the printing dots may be altered or tailored by combining different wavelengths of UV light. Specifically, the inventors of the present invention have determined that it is possible to create printing dots having desired geometric characteristics, including a planarity of a top surface of the relief printing dots, a desired shoulder angle of the relief printing dots and a desired edge sharpness of the relief printing dots by combining UV-A and UV-C light during the face exposure step. Furthermore, in order to achieve the best result in terms of the geometric characteristics of the relief printing dots, UV-A and UV-C light is applied simultaneously. Most flexographic printing plate facilities are equipped with finishing units, which makes it particularly convenient, as these systems are equipped with both UV-A and UV-C bulbs which are capable of being utilized simultaneously.

In one embodiment, the present invention relates generally to a method of tailoring the shape of a plurality of relief printing dots created in a photosensitive printing blank during a platemaking process, said photosensitive printing blank comprising at least one photocurable layer disposed on a backing layer, the method comprising the steps of:

a) selectively exposing the at least one photocurable layer to a source of actinic radiation to selectively crosslink and cure portions of the at least one photocurable layer; and b) developing the exposed at least one photocurable layer to reveal the relief image therein, said relief image comprising the plurality of relief printing dots;

wherein the source of actinic radiation comprises at least one source of UV light in the UV-A range and at least one source of light in the UV-C range, wherein the at least one photocurable layer is simultaneously exposed to the at least one source of UV light in the UV-A range and the at least one source of UV light in the UV-C range;

whereby the printing dots are produced having at least one geometric characteristic selected from the group consisting of a desired planarity of a top surface of the relief printing dots, a desired shoulder angle of the relief printing dots and a desired edge sharpness of the relief printing dots.

As described herein, a combination of different wavelength UV lights is used to control the shape and angle of the printing dots. More specifically, the source of actinic radiation comprises at least one source of UV light in the UV-A range and at least one source of light in the UV-C range, wherein the source of UV-A light and the source of UV-C light operate simultaneously to selectively crosslink and cure the at least one photocurable layer.

The suitability of a particular actinic radiation source is governed by the photosensitivity of the photo initiator used in preparing the photocurable layer. Thus, the choice of the right output spectrum is very important for successful curing applications. In particular, the lamp output must match the absorption spectrum of the photoinitiator. It is preferable for the photocurable layer to have both a photoinitiator responsive to UV-A light and a photoinitiator responsive to UV-C light. A photoinitiator is responsive to the wavelength of UV light that is most strongly absorbed by the photoinitiator (i.e. the wavelength where the absorption peak is for the particular photoinitiator in the UV range.)

Examples of UV-A sources include carbon arcs, mercury-vapor arcs, fluorescent lamps, electron flash units, electron beam units, lasers, photographic flood lamps, and UV LEDs. The most suitable sources of UV radiation are mercury vapor lamps, particularly sun lamps. These radiation sources generally emit long-wave UV radiation between 310-400 nm. The exposure time of the printing element to at least one source of UV-A light may vary from a few seconds to minutes, depending upon the intensity and spectral energy distribution of the radiation, its distance from the photocurable element, and the nature and thickness of the at least one photocurable layer.

Sources of UV-C radiation include low pressure mercury lamps, high pressure mercury lamps, germicidal lamps, and heavy hydrogen lamps. The simultaneous exposure time of the printing element to the at least one source of UV-C light typically varies between about 30 seconds and about 8 minutes, more preferably about 1 minute to about 5 minutes, depending upon the intensity and spectral energy distribution of the radiation, its distance from the photocurable element and the nature and thickness of the at least one photocurable layer.

Following imagewise main exposure to UV-A radiation and UV-C radiation simultaneously through the mask and removal of the photomask if it is a separate film, the photosensitive printing element is treated to remove unpolymerized areas in the photopolymerizable layer and thereby form a relief image. The treating step removes the portions of the photopolymerizable layer in the areas which were not exposed to actinic radiation, i.e., the unexposed areas or uncured areas, of the photopolymerizable layer. For photosensitive elements including a separate IR-sensitive layer for digital formation of the mask, the treating step that forms the relief image in the photopolymerizable layer may also remove the mask (which had been exposed to actinic radiation).

Development of the photosensitive printing element includes (1) "wet" development wherein the photopolymerizable layer is contacted with a suitable developer solution to washout unpolymerized areas and (2) dry "thermal" development wherein the photosensitive element is heated to a development temperature which causes the unpolymerized areas of the photopolymerizable layer to melt or soften or flow and is wicked away by contact with an absorbent material. These processes are generally well known in the art.

Following development, the relief printing plates may be blotted or wiped dry, and then more fully dried in a forced air or infrared oven.

After the development step, the photosensitive element can be uniformly post-exposed to ensure that the photopolymerization process is complete and that the flexographic printing plate will remain stable during printing and storage.

Furthermore, if the surface of the flexographic printing plate is still tacky, one or more detackification treatments may be applied. Such methods, also referred to as "finishing", are well known in the art. For example, tackiness can be eliminated by a treatment of the flexographic printing plate with bromine or chlorine solutions.

EXAMPLE

Different printing plate formulations were investigated to study the effects of exposing the printing plate formulations to UV-A and/or UV-C light sources. These printing plate formulations included Formulation 1, which used 2,2-Dimethoxy-1,2-diphenylethan-1-one, available from BASF under the tradename Irgacure® 651, as the photoinitiator, and Formulation 2, which used a combination of 2,2-Dimethoxy-1,2-diphenylethan-1-one and 2-Benzyl-2-dimethylamino-1-(4-morpholinophenyl)-butanone-1, available from BASF under the tradename Irgacure®369 as the photoinitiator. Irgacure® 651 has a strong absorption in the UV-C region whereas Irgacure® 369 was found to have a strong absorption around 365 nm.

The source of UV-A light used in the studies was a finishing exposing unit fluorescent lamp operating at a wavelength of 345-400 nm and the source of UV-C light used in the studies was a finishing exposing detackification lamp operating at a wavelength of 250 nm. The exposure time of the printing plates to UV-A light in all of the examples was 15 minutes at 10 mW. The exposure time of the printing plates to UV-C light varied between about 1 and about 5 minutes as described below.

After the printing plate formulations were exposed to actinic radiation, including UV-A light, UV-C light, or both, the printing plates were developed to reveal the relief image therein. The developing step utilized in the examples was a solvent process.

FIG. 1 depicts the effect of the simultaneous application of UV-A and UV-C light on different chemistries (Formulation 1 and Formulation 2) for 10% dots. As set forth in FIG. 1, printing plates comprising Formulation 1 and Formulation 2 were imaged using UV-A light and simultaneously with UV-C light for one minute as compared with imaging using UV-A light and no UV-C. As can be seen from FIG. 1, the printing plates imaged using both UV-A and UV-C light comprises printing dots having flat tops, especially for Formulation 2, as compared with the printing plates imaged using only UV-A light.

Figure 2:
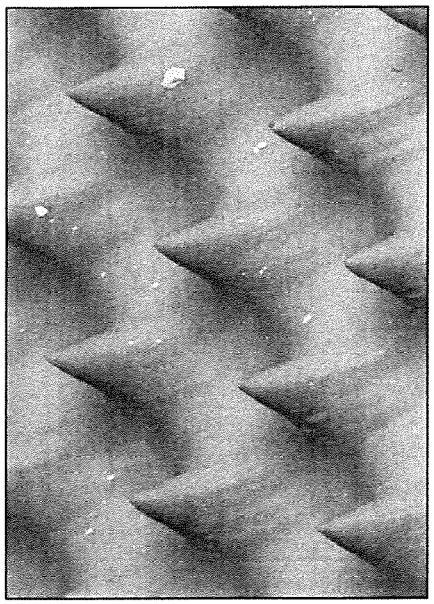
FIG. 2 depicts SEMs of 10% dots imaged using UV-A radiation followed sequentially by UV-C radiation and UV-C radiation followed sequentially by UV-A radiation.
Figure 2:
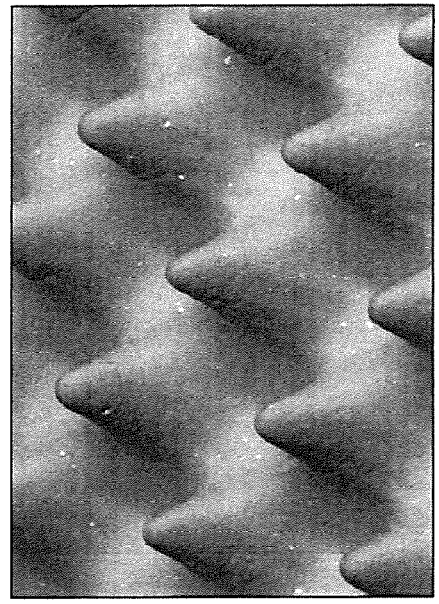
Figure 2:
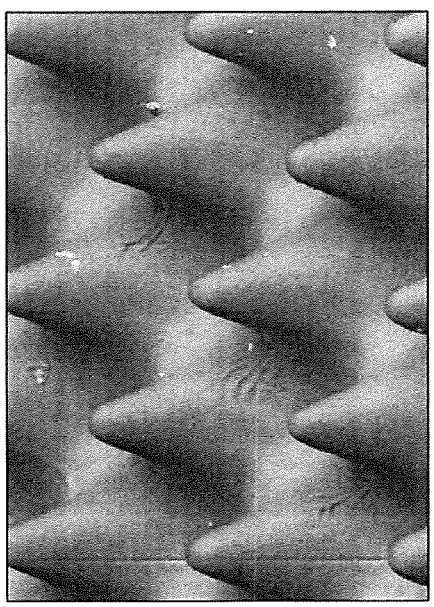
Figure 2:
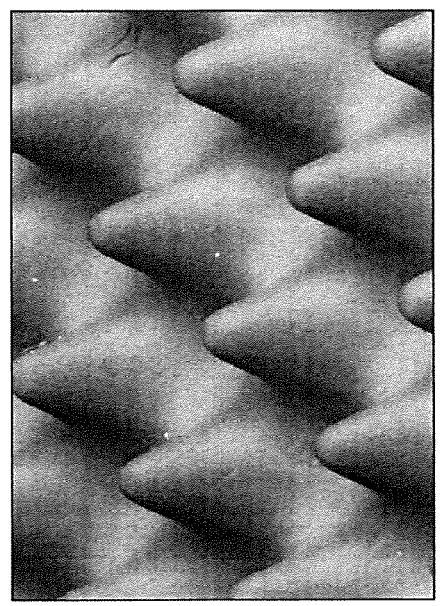

FIG. 2 depicts the effect of the sequential application of UV-A and UV-C light on different chemistries (Formulation 1 and Formulation 2) for 10% dots. As set forth in FIG. 2, printing plates comprising Formulation 1 and Formulation 2 were imaged using UV-A light followed by UV-C light for 3 minutes as compared with using UV-C light for 3 minutes and then UV-A light. As can be seen, in both instances, the printing dots do not exhibit flat tops, but instead exhibit rounded tops, and in the case of Formulation 2 imaged using UV-C followed by UV-A light, the dots come to a point, which would not be effective for printing.

Figure 3:
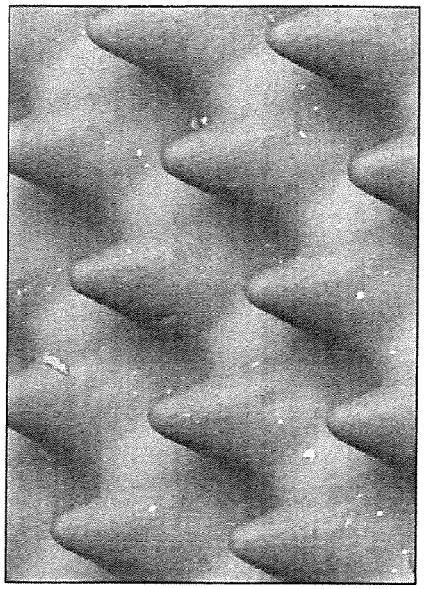
FIG. 3 depicts SEMs of 10% dots imaged using just UV-A radiation or just UV-C radiation.
Figure 3:
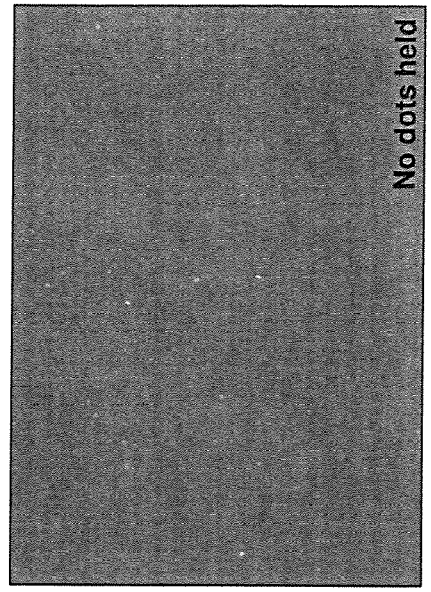
Figure 3:
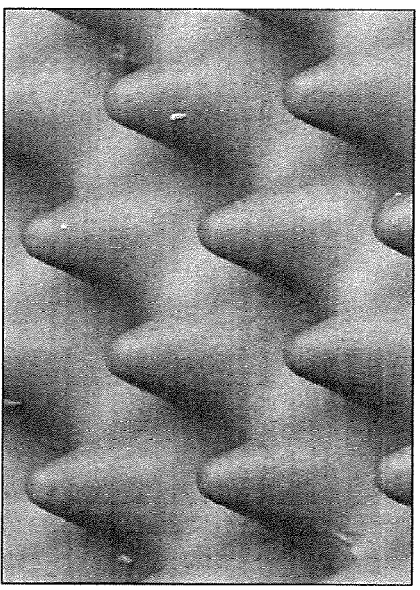
Figure 3:
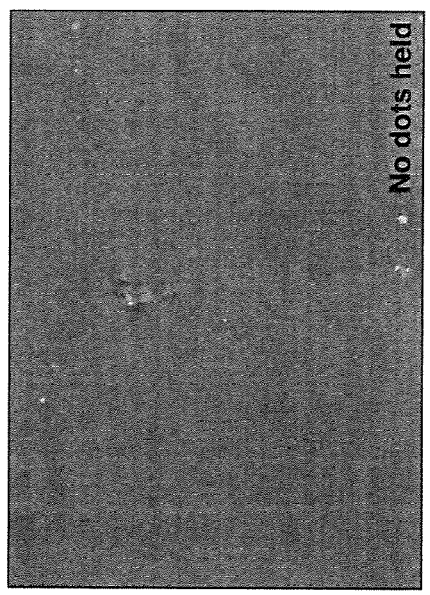

FIG. 3 depicts a comparison of curing using UV-A light versus UV-C light for Formulation 1 and Formulation 2 chemistries. As can be seen from FIG. 3, when the printing plates were subjected to only UV-C light for 5 minutes and no UV-A light, no dots were held. When the printing plates were subjected to only UV-A light and no UV-C light, the dots exhibited rounded tops.

Figure 4:
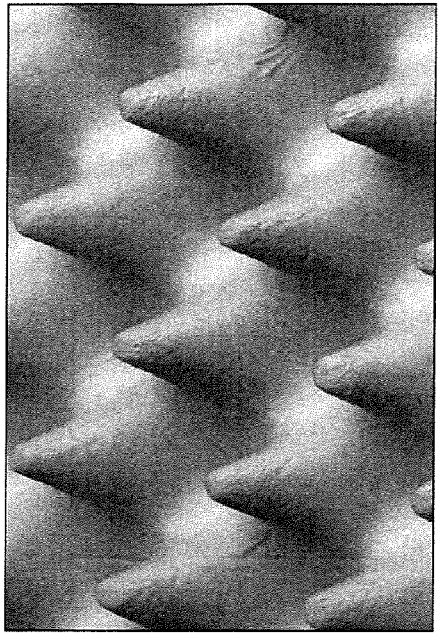
FIG. 4 depicts SEMs showing the effect of the UV-C dose on bump up for one printing plate formulation.
Figure 4:
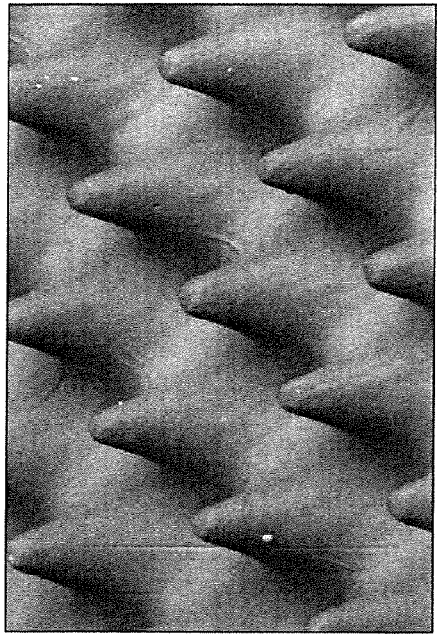
Figure 4:
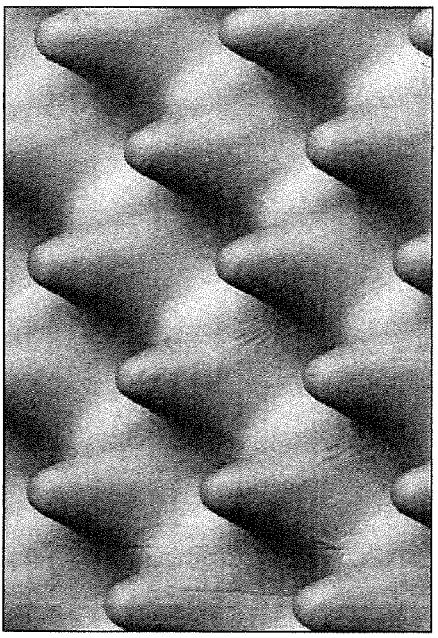
Figure 4:
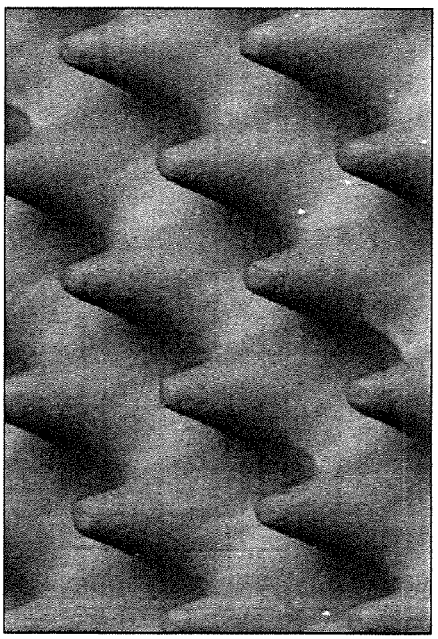
Figure 5:
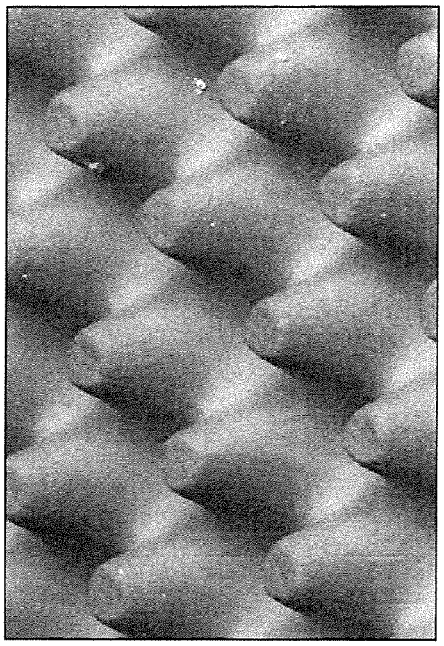
FIG. 5 depicts SEMs showing the effect of UV-C dose on 20% dots for one printing plate formulation.
Figure 5:
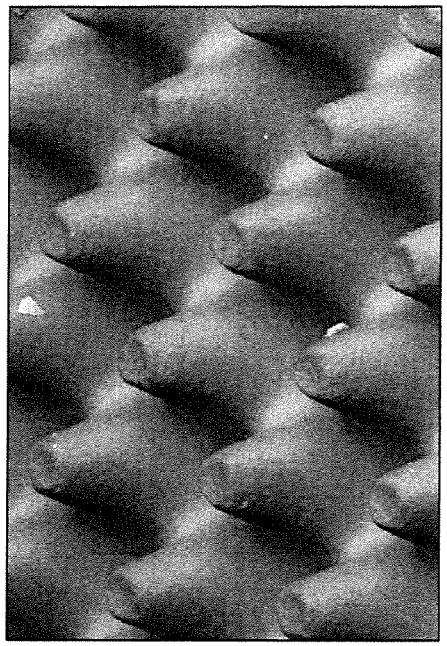
Figure 5:
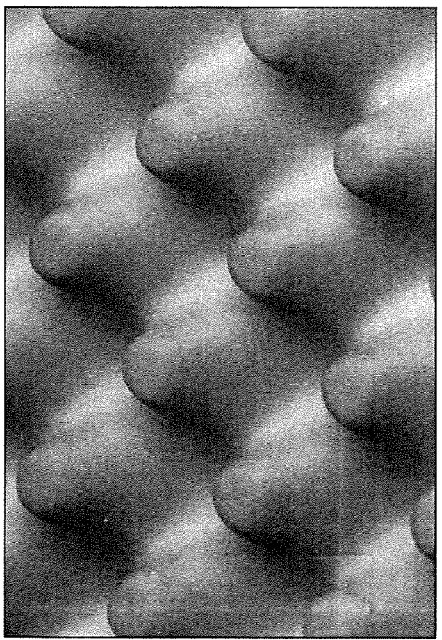
Figure 5:
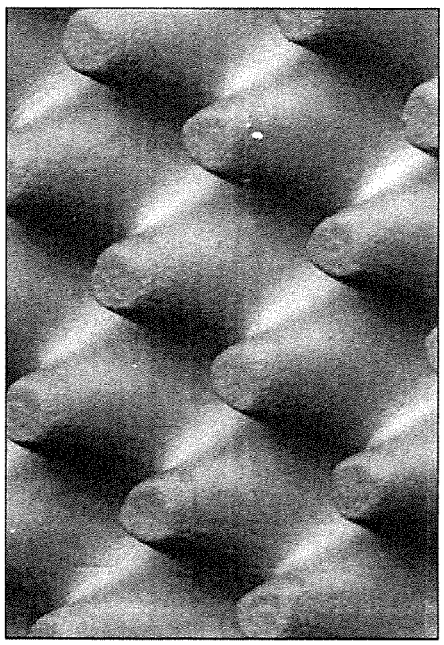

FIG. 4 demonstrates the effect of the UV-C dose on bump up for 10% dots for the Formulation 1 chemistry, in which the printing plates were subjected to UV-A and no UV-C light, UV-A light simultaneously with UV-C light for 1 minute, UV-A light simultaneously with UV-C light for 3 minutes, and UV-A light simultaneously with UV-C light for 5 minutes. As can be seen from FIG. 4, the printing plates subjected to only UV-A light exhibit rounded tops, while the printing plates subjected to UV-A and UV-C light simultaneously exhibit dots have flatter tops, especially when the UV-C light source is applied for 3 minutes or more. This can be seen more clearly in FIG. 5, which demonstrates the effect of the UV-C on bump up for the Formulation 1 chemistry. As can be seen from FIG. 5, the printing plates subjected to only UV-A light exhibit rounded tops and rounded edges on the printing dots, while the printing dots subjected to UV-A and UV-C light simultaneously exhibit dots having flat tops and sharp edge definition.

Figure 6:
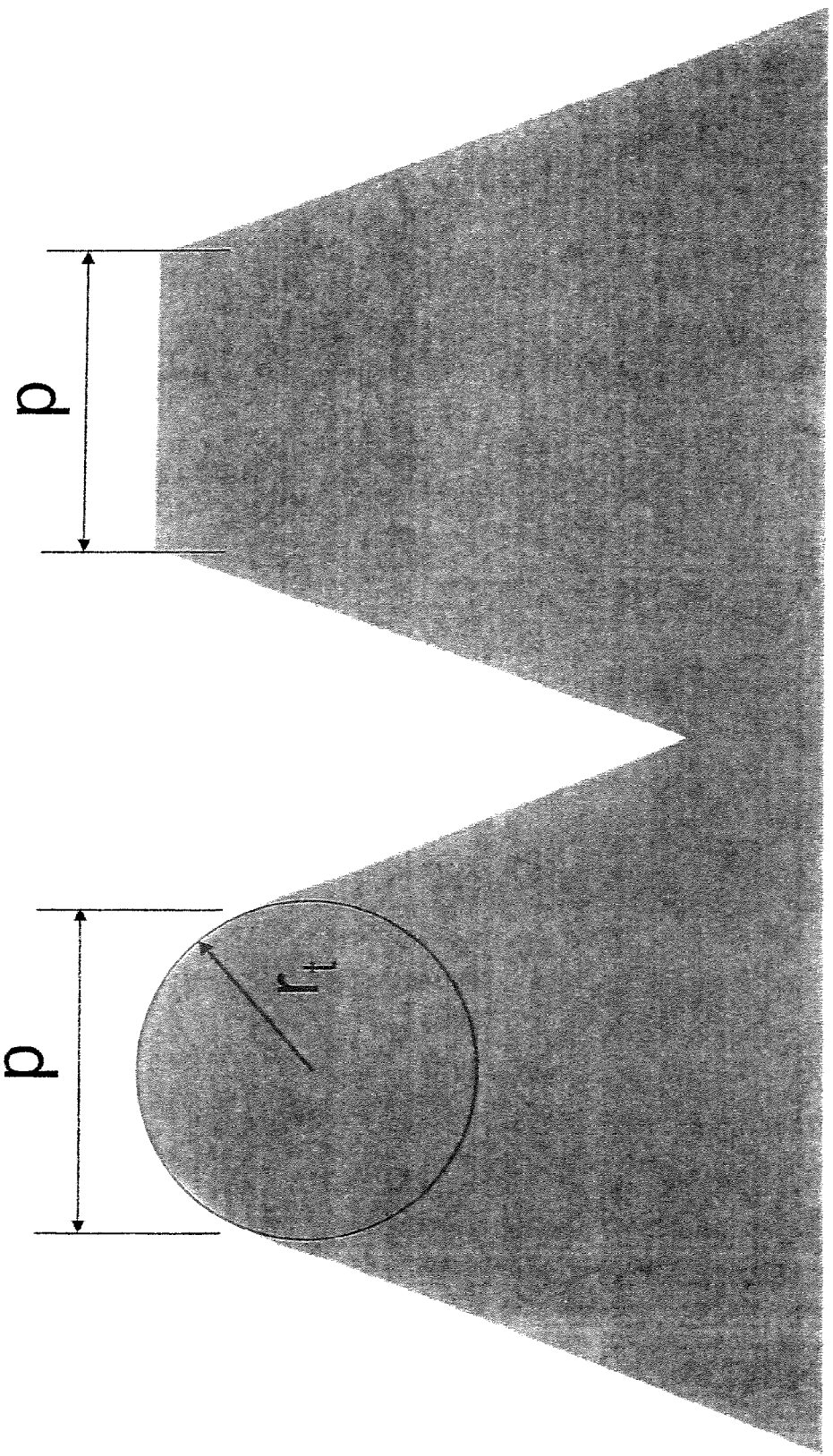
FIG. 6 depicts a means of characterizing the planarity of a dot's printing surface where p is the distance across the dot top, and $r_t$ is the radius of curvature across the surface of the dot.

The planarity of the top of a dot can be measured as the radius of curvature across the top surface of the dot, $r_e$ as shown in FIG. 6. It is noted that a rounded dot surface is not ideal from a printing perspective because the size of the contact patch between the print surface and the dot varies exponentially with impression force. Therefore, the top of the dot preferably has a planarity where the radius of curvature of the dot top is greater than the thickness of the photopolymer layer, more preferably twice the thickness of the photopolymer layer, and most preferably more than three times the total thickness of the photopolymer layer.

Figure 7:
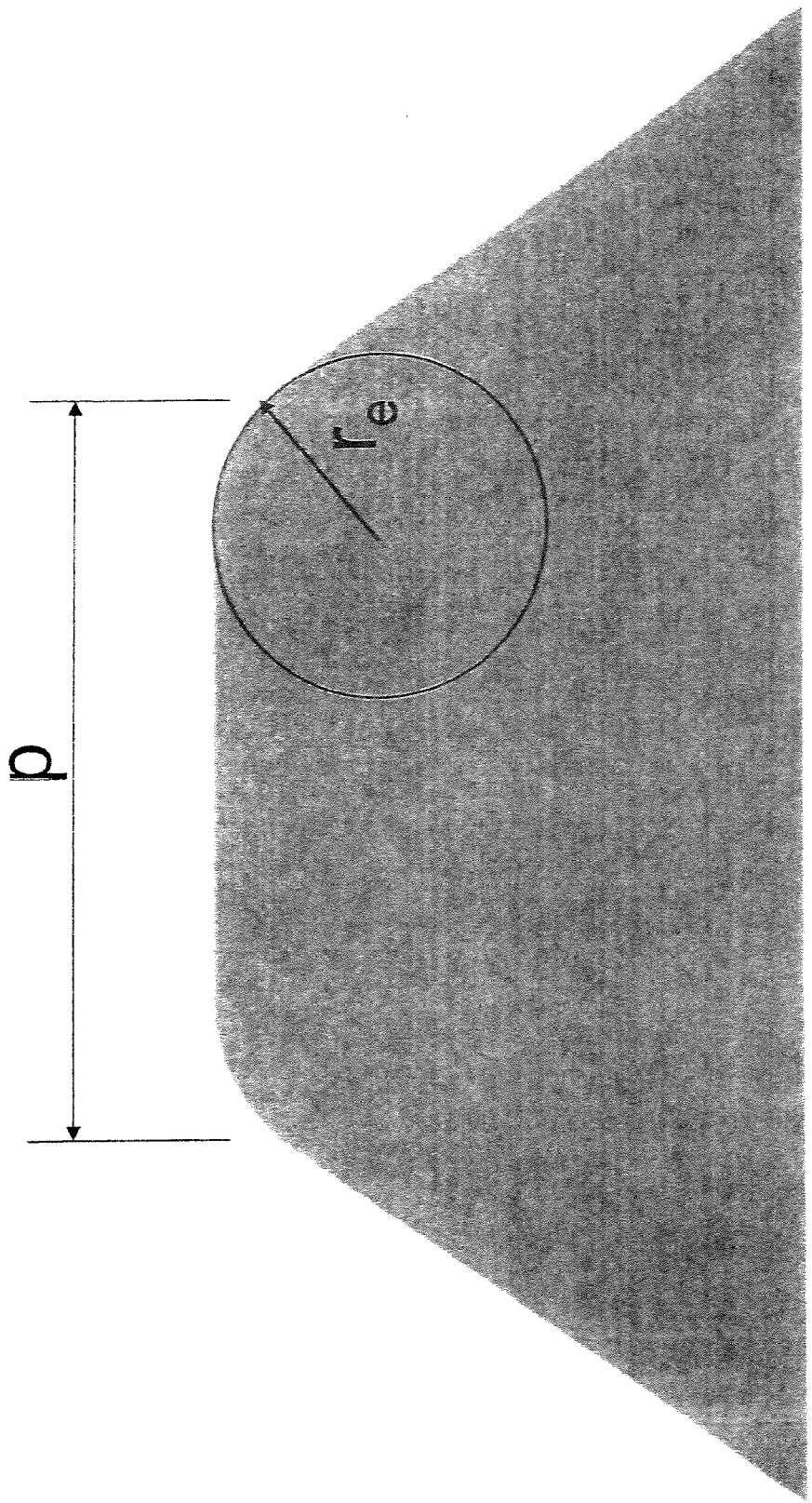
FIG. 7 depicts a flexo dot and its edge, where p is the distance across the dot top. This is used in the characterization of edge sharpness $r_e$:p, where $r_e$ is the radius of curvature at the intersection of the shoulder and the top of the dot.

The angle of the dot shoulder is defined as shown in FIG. 7 as the angle θ formed by the dot's top and side. At the extreme, a vertical column would have a 90° shoulder angle, but in practice most flexo dots have an angle that is considerably lower, often nearer 45° than 90°.

A dot shoulder angle of >50° is preferred throughout the tonal range. As used herein, dot shoulder angle means the angle formed by the intersection of a horizontal line tangential to the top of the dot and a line representing the adjacent dot side wall as shown in FIG. 7.

Figure 8:
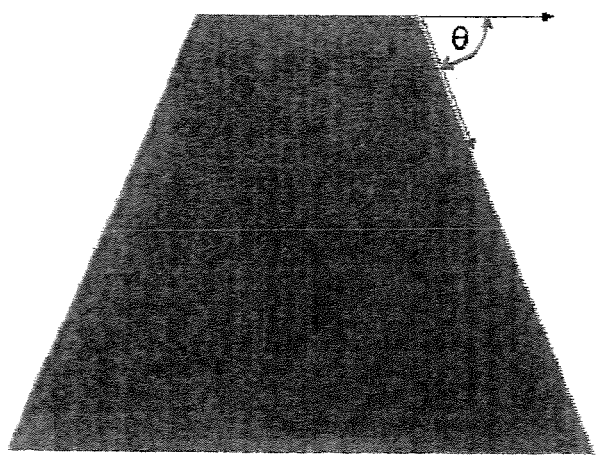
FIG. 8 depicts the measurement of the dot shoulder angle θ.

Edge sharpness relates to the presence of a well-defined boundary between the planar dot top and the shoulder and it is generally preferred that the dot edges be sharp and defined, as shown in FIG. 8. These well-defined dot edges better separate the "printing" portion from the "support" portion of the dot, allowing for a more consistent contact area between the dot and the substrate during printing.

Edge sharpness can be defined as the ratio of $r_e$, the radius of curvature (at the intersection of the shoulder and the top of the dot) to p, the width of the dot's top or printing surface, as shown in FIG. 8. For a truly round-tipped dot, it is difficult to define the exact printing surface because there is not really an edge in the commonly understood sense, and the ratio of $r_e$:p can approach 50%. In contrast, a sharp-edged dot would have a very small value of $r_e$, and $r_e$:p would approach zero. In practice, an $r_e$:p of less than 5% is preferred, with an $r_e$:p of less than 2% being most preferred. FIG. 8 depicts a flexo dot and its edge, where p is the distance across the dot top and demonstrates the characterization of edge sharpness, $r_e$:p, where $r_e$ is the radius of curvature at the intersection of the shoulder and the top of the dot.

What is claimed is:

1. A method of tailoring the shape of a plurality of relief printing dots created in a photosensitive printing blank during a platemaking process, said photosensitive printing blank comprising at least one photocurable layer disposed on a backing layer, the method comprising the steps of:
   a) selectively exposing the at least one photocurable layer to a source of actinic radiation to selectively crosslink and cure portions of the at least one photocurable layer; and
   b) developing the exposed at least one photocurable layer to reveal a relief image therein, said relief image comprising the plurality of relief printing dots;
   wherein the source of actinic radiation comprises at least one source of UV light in a UV-A range and at least one source of light in a UV-C range, wherein the at least one photocurable layer is simultaneously exposed to the at least one source of UV light in the UV-A range and the at least one source of UV light in the UV-C range;
   whereby printing dots are produced having at least one geometric characteristic selected from the group consisting of a desired planarity of a top surface of the relief printing dots, a desired shoulder angle of the relief printing dots and a desired edge sharpness of the relief printing dots.

2. The method according to claim 1, wherein the UV-A light source is selected from the group consisting of carbon arcs, mercury-vapor arcs, fluorescent lamps, electron flash units, electron beam units, lasers, photographic flood lamps, and UV LEDs.

3. The method according to claim 1, wherein the UV-A light source emits at wavelengths of between about 300 nm and about 400 nm.

4. The method according to claim 1, wherein the UV-C light source is selected from the group consisting of low pressure mercury lamps, high pressure mercury lamps, germicidal lamps, and heavy hydrogen lamps.

5. The method according to claim 1, wherein the UV-C light source emits at a wavelength of between about 200 nm and about 300 nm.

6. The method according to claim 1, wherein an exposure time of the at least one photocurable layer to the at least one source of UV-C light is between about 30 seconds and about 8 minutes.

7. The method according to claim 6, wherein the exposure time of the at least one photocurable layer to the at least one source of UV-C light is between about 1 minute and about 5 minutes.

8. The method according to claim 1, wherein the angle of the relief printing dot shoulder is greater than about 50°.

9. The method according to claim 1, wherein the edge sharpness of the relief printing dots, defined as the ratio of the radius of curvature $r_e$ at the intersection of a shoulder and the top of the relief printing dot to the width of the dot's top printing surface p is less than about 5%.

10. The method according to claim 9, wherein the ratio of $r_e$:p is less than about 2%.

11. The method according to claim 1 wherein the relief printing dots comprise a planarity that is greater than the thickness of the at least one photocurable layer.

12. The method according to claim 1 wherein the at least one photocurable layer comprises both a photoinitiator which is responsive to UV-A light and a photoinitiator which is responsive to UV-C light or a photoinitiator which is sensitive to both UV-A and UV-C light.

* * * * *